(12) United States Patent
Tanaka et al.

(10) Patent No.: US 9,527,944 B2
(45) Date of Patent: Dec. 27, 2016

(54) PRESSURE-SENSITIVE ADHESIVE LAYER FOR TRANSPARENT CONDUCTIVE FILM, TRANSPARENT CONDUCTIVE FILM WITH PRESSURE-SENSITIVE ADHESIVE LAYER, TRANSPARENT CONDUCTIVE LAMINATE, AND TOUCH PANEL

(71) Applicant: NITTO DENKO CORPORATION, Ibaraki-shi, Osaka (JP)

(72) Inventors: Akiko Tanaka, Osaka (JP); Aimi Matsuura, Osaka (JP); Katsuhiko Kamiya, Osaka (JP); Masatsugu Higashi, Osaka (JP); Mizue Yamasaki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 432 days.

(21) Appl. No.: 13/693,935

(22) Filed: Dec. 4, 2012

(65) Prior Publication Data

US 2013/0141879 A1    Jun. 6, 2013

(30) Foreign Application Priority Data

Dec. 5, 2011 (JP) ................................. 2011-265937

(51) Int. Cl.
*C08F 265/06* (2006.01)
*C08F 271/02* (2006.01)
(Continued)

(52) U.S. Cl.
CPC ........... *C08F 265/06* (2013.01); *C08F 265/04* (2013.01); *C08F 271/02* (2013.01);
(Continued)

(58) Field of Classification Search
USPC .......................... 345/173; 428/141, 220, 355
See application file for complete search history.

(56) References Cited

U.S. PATENT DOCUMENTS

| 2008/0176042 A1 | 7/2008 | Nashiki et al. |
| 2010/0013798 A1 | 1/2010 | Nakajima et al. |
(Continued)

FOREIGN PATENT DOCUMENTS

| JP | 2005-154581 A | 6/2005 |
| JP | 2007-084762 A | 4/2007 |
(Continued)

OTHER PUBLICATIONS

Submission of Information in corresponding Patent Application No. 2011-265937, filed Nov. 17, 2014.
(Continued)

*Primary Examiner* — Humera Sheikh
*Assistant Examiner* — Lucas Wang
(74) *Attorney, Agent, or Firm* — Sughrue Mion, PLLC

(57) ABSTRACT

Provided is a pressure-sensitive adhesive layer for a transparent conductive film having a patterned transparent conductive thin film, which has transparent as the pressure-sensitive adhesive layer for transparent conductive film and can prevent the patterned transparent conductive thin film from degrading the appearance of the conductive film. A pressure-sensitive adhesive layer for a transparent conductive film having a patterned transparent conductive thin film, wherein the pressure-sensitive adhesive layer is made from an acrylic pressure-sensitive adhesive composition containing: 100 parts by weight of an acryl-based polymer obtained by polymerization of a monomer component including an alkyl(meth)acrylate; and 30 to 150 parts by weight of a styrene-based oligomer, the pressure-sensitive adhesive layer has a refractive index of 1.50 or more, the pressure-sensitive adhesive layer has a haze of 2% or less as measured at a thickness of 30 μm.

14 Claims, 1 Drawing Sheet

(51) Int. Cl.
*C09D 151/00* (2006.01)
*G06F 3/00* (2006.01)
*H05K 1/03* (2006.01)
*C08F 265/04* (2006.01)
*C09J 7/02* (2006.01)
*C09J 151/00* (2006.01)
*G06F 3/044* (2006.01)

(52) U.S. Cl.
CPC ........ *C09D 151/003* (2013.01); *C09J 7/0296* (2013.01); *C09J 151/003* (2013.01); *H05K 1/0306* (2013.01); *C09J 2201/602* (2013.01); *C09J 2203/318* (2013.01); *C09J 2425/00* (2013.01); *C09J 2451/00* (2013.01); *G06F 3/044* (2013.01)

(56) References Cited

U.S. PATENT DOCUMENTS

| | | | |
|---|---|---|---|
| 2010/0243295 A1* | 9/2010 | Allemand et al. | 174/250 |
| 2011/0135892 A1 | 6/2011 | Nashiki et al. | |
| 2011/0141059 A1 | 6/2011 | Nashiki et al. | |
| 2011/0143105 A1 | 6/2011 | Nashiki et al. | |
| 2011/0147340 A1 | 6/2011 | Nashiki et al. | |
| 2011/0217542 A1 | 9/2011 | Moroishi et al. | |

FOREIGN PATENT DOCUMENTS

| | | |
|---|---|---|
| JP | 2009-76432 A | 4/2009 |
| JP | 2010-15861 A | 1/2010 |
| JP | 2010-27391 A | 2/2010 |
| JP | 2010-43156 A | 2/2010 |
| JP | 2010-76232 A | 4/2010 |
| JP | 2010-137447 A | 6/2010 |

OTHER PUBLICATIONS

Japanese Office Action issued in corresponding Japanese Patent Application No. 2011-265937 dated Jun. 1, 2015.
Chinese Office Action issued in corresponding Chinese Patent Application No. 201210514762.4 dated Jul. 17, 2015.
Taiwanese Office Action issued in corresponding Taiwanese Patent Application No. 101145720 issued May 24, 2016.
Chinese Office Action issued in corresponding Chinese Application No. 201210514762.4 issued Apr. 1, 2016.

* cited by examiner

PRESSURE-SENSITIVE ADHESIVE LAYER FOR TRANSPARENT CONDUCTIVE FILM, TRANSPARENT CONDUCTIVE FILM WITH PRESSURE-SENSITIVE ADHESIVE LAYER, TRANSPARENT CONDUCTIVE LAMINATE, AND TOUCH PANEL

BACKGROUND OF THE INVENTION

Field of the Invention

The invention relates to a pressure-sensitive adhesive layer for a transparent conductive film having a patterned transparent conductive thin film and to a transparent conductive film with pressure-sensitive adhesive layer. The invention also relates to a transparent conductive laminate produced using the transparent conductive film with pressure-sensitive adhesive layer. The transparent conductive film with pressure-sensitive adhesive layer or the transparent conductive laminate may be subjected to a processing treatment as needed and then used to form a transparent electrode for a display such as a liquid crystal display or an electroluminescence display or a touch panel such as an optical, ultrasonic, capacitance, or resistive touch panel. Particularly, the transparent conductive film with pressure-sensitive adhesive layer of the invention is suitable for use as an electrode substrate of an input device in a capacitive touch panel.

Description of the Related Art

A conventionally known transparent conductive film includes a transparent film substrate and a transparent conductive thin film (such as an ITO film) placed on the substrate. When used, such a transparent conductive film also forms a transparent conductive film with pressure-sensitive adhesive layer, which has a pressure-sensitive adhesive layer provided, for bonding to other members, on the film substrate of the transparent conductive film on the side where the transparent conductive thin film is not provided.

The transparent conductive thin film is patterned when the transparent conductive film or the transparent conductive film with pressure-sensitive adhesive layer is used as an electrode substrate for a capacitive touch panel (JP-A-2009-076432). The transparent conductive film with pressure-sensitive adhesive layer having such a patterned transparent conductive thin film is used together with any other transparent conductive film or the like to form a laminate, which is advantageously used for a multi-touch input device that can be operated with two or more fingers at the same time.

Unfortunately, by the patterning of the transparent conductive thin film, a step is formed in the transparent conductive thin film so that a clear difference is made between the patterned and non-patterned parts to degrade the appearance. Specifically, the presence and absence of the pattern clearly appears to degrade the appearance when external light from the viewer side is reflected from the transparent conductive thin film or when internal light from the display device side is transmitted through the transparent conductive thin film.

Thus, there is proposed a transparent conductive film in which an anchor coat layer composed of high-refractive-index and low-refractive-index layers is interposed between a substrate and a transparent conductive thin film formed thereon, and the thickness of each anchor coat layer is adjusted, so that the pattern of the transparent conductive thin film is made less visible (JP-A-2010-015861). There is also proposed a transparent conductive film in which a light transmittance-reducing layer such as a colored layer is placed on a transparent conductive film so that the pattern of a transparent conductive thin film is made less visible (JP-A-2010-027391). There is also a study in which the pattern of a transparent conductive thin film is made less visible by reducing the difference in light transmittance or reflectance between the patterned and non-patterned parts of the transparent conductive thin film.

SUMMARY OF THE INVENTION

The degradation of the appearance caused by patterning has been found to be significant particularly when the transparent conductive thin film is crystallized by heat-treating the transparent conductive film. In addition, the degradation of the appearance has been found to be caused by a step formed in the transparent conductive thin film by patterning.

An object of the invention is to provide a pressure-sensitive adhesive layer that is for use on a transparent conductive film having a patterned transparent conductive thin film, has transparency as the pressure-sensitive adhesive layer for transparent conductive film, and can prevent the patterning from degrading the appearance.

Another object of the invention is to provide: a transparent conductive film with pressure-sensitive adhesive layer having a patterned transparent conductive thin film and the pressure-sensitive adhesive layer provided on the pattered transparent conductive thin film; a transparent conductive laminate produced using the transparent conductive film with pressure-sensitive adhesive layer; and a touch panel produced using the transparent conductive film with pressure-sensitive adhesive layer or the transparent conductive laminate.

Means for Solving the Problems

As a result of intense investigations to solve the problems, the inventors have made the invention, based on the finding that the objects are achieved with a pressure-sensitive adhesive layer for transparent conductive film or others described below.

Specifically, the invention is directed to a pressure-sensitive adhesive layer for a transparent conductive film having a patterned transparent conductive thin film,
wherein the pressure-sensitive adhesive layer is made from an acrylic pressure-sensitive adhesive composition containing: 100 parts by weight of an acryl-based polymer obtained by polymerization of a monomer component including an alkyl(meth)acrylate; and 30 to 150 parts by weight of a styrene-based oligomer,
the pressure-sensitive adhesive layer has a refractive index of 1.50 or more,
the pressure-sensitive adhesive layer has a haze of 2% or less as measured at a thickness of 30 μm.

In the pressure-sensitive adhesive layer for a transparent conductive film, the styrene-based oligomer preferably has a softening point of 95° C. or less.

In the pressure-sensitive adhesive layer for a transparent conductive film, the monomer components used to form the acryl-based polymer preferably further include an aromatic group-containing monomer as a copolymerizable monomer. The aromatic group-containing monomer is preferably incorporated in the acryl-based polymer by graft polymerization.

In the pressure-sensitive adhesive layer for a transparent conductive film, the acryl-based polymer used is preferably obtained by radiation polymerization of the monomer component including the alkyl(meth)acrylate.

The invention is also directed to a transparent conductive film with pressure-sensitive adhesive layer, including: a first transparent plastic film substrate; a patterned transparent conductive thin film provided on one surface of the substrate; and the pressure-sensitive adhesive layer provided on the transparent conductive thin film.

The transparent conductive film with pressure-sensitive adhesive layer may further includes at least one undercoat layer, wherein the transparent conductive thin film is provided on the first transparent plastic film substrate with the undercoat layer interposed therebetween.

The transparent conductive film with pressure-sensitive adhesive layer may further include an oligomer blocking layer provided on the other surface of the first transparent plastic film substrate, wherein the transparent conductive thin film is not provided on the other surface.

The invention also relates to a transparent conductive laminate, including:

the above transparent conductive film with pressure-sensitive adhesive layer; and a second transparent plastic film substrate bonded to the pressure-sensitive adhesive layer of the transparent conductive film with pressure-sensitive adhesive layer.

The invention also relates to a touch panel, including an electrode plate including the above transparent conductive film with pressure-sensitive adhesive layer or the above transparent conductive laminate.

The degradation of the appearance of a transparent conductive film having a patterned transparent conductive thin film is considered to be caused by the difference in reflectance between the patterned and non-patterned parts of the transparent conductive thin film. The pressure-sensitive adhesive layer of the invention, which contains a styrene-based oligomer, has a relatively high refractive index, and also has a haze of 2% or less and therefore transparency. The pressure-sensitive adhesive layer bonded to the patterned transparent conductive thin film can reduce the difference in reflectance between the patterned and non-patterned parts to suppress the degradation of the appearance caused by the patterning of the transparent conductive thin film.

DETAILED DESCRIPTION OF THE PREFERRED EMBODIMENTS

Figure 1:
FIG. 1 is a cross-sectional view showing an example of the transparent conductive film with pressure-sensitive adhesive layer of the invention.

First, a description is given of the pressure-sensitive adhesive layer of the invention for a transparent conductive film. The pressure-sensitive adhesive layer of the invention for a transparent conductive film is made from an acrylic pressure-sensitive adhesive composition containing an acryl-based polymer. The acryl-based polymer is obtained by polymerization of a monomer component including an alkyl(meth)acrylate as a main component.

For example, the alkyl(meth)acrylate used to form the main skeleton of the acryl-based polymer may be an alkyl (meth)acrylate having a straight or branched chain alkyl group of 1 to 20 carbon atoms. For example, the alkyl group may be methyl, ethyl, propyl, isopropyl, butyl, isobutyl, amyl, hexyl, cyclohexyl, heptyl, 2-ethylhexyl, isooctyl, nonyl, decyl, isodecyl, dodecyl, isomyristyl, lauryl, tridecyl, pentadecyl, hexadecyl, heptadecyl, octadecyl, or the like. These may be used alone or in any combination. The alkyl group preferably has 2 to 14 carbon atoms, more preferably 2 to 6 carbon atoms.

In order to improve tackiness or heat resistance, one or more copolymerizable monomers having an unsaturated double bond-containing polymerizable functional group such as a (meth)acryloyl group or a vinyl group may be introduced into the acryl-based polymer by copolymerization. Examples of such copolymerizable monomers include hydroxyl group-containing monomers such as 2-hydroxyethyl(meth)acrylate, 3-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)-methyl acrylate; carboxyl group-containing monomers such as (meth)acrylic acid, carboxyethyl(meth)acrylate, carboxypentyl(meth)acrylate, itaconic acid, maleic acid, fumaric acid, and crotonic acid; acid anhydride group-containing monomers such as maleicanhydride and itaconic anhydride; caprolactone adducts of acrylic acid; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl(meth)acrylate, and (meth)acryloyloxynaphthalenesulfonic acid; and phosphate group-containing monomers such as 2-hydroxyethylacryloyl phosphate.

Examples of such monomers for modification also include (N-substituted) amide monomers such as (meth)acrylamide, N,N-dimethyl(meth)acrylamide, N-butyl(meth)acrylamide, N-methylol(meth)acrylamide, and N-methylolpropane (meth)acrylamide; alkylaminoalkyl(meth)acrylate monomers such as aminoethyl (meth)acrylate, N,N-dimethylaminoethyl (meth)acrylate, and tert-butylaminoethyl (meth) acrylate; alkoxyalkyl(meth)acrylate monomers such as methoxyethyl (meth)acrylate and ethoxyethyl (meth)acrylate; succinimide monomers such as N-(meth)acryloyloxymethylenesuccinimide, N-(meth)acryloyl-6-oxyhexamethylenesuccinimide, N-(meth)acryloyl-8-oxyoctamethylenesuccinimide, and N-acryloylmorpholine; maleimide monomers such as N-cyclohexylmaleimide, N-isopropylmaleimide, N-laurylmaleimide, and N-phenylmaleimide; and itaconimide monomers such as N-methylitaconimide, N-ethylitaconimide, N-butylitaconimide, N-octylitaconimide, N-2-ethylhexylitaconimide, N-cyclohexylitaconimide, and N-laurylitaconimide.

Examples of modifying monomers that may also be used include vinyl monomers such as vinyl acetate, vinyl propionate, N-vinylpyrrolidone, N-vinylcarboxylic acid amides, and N-vinylcaprolactam; cyano group-containing monomers such as acrylonitrile and methacrylonitrile; epoxy group-containing acrylic monomers such as glycidyl(meth) acrylate; glycol acrylate monomers such as polyethylene glycol(meth)acrylate, polypropylene glycol(meth)acrylate, methoxyethylene glycol(meth)acrylate, and methoxypolypropylene glycol(meth)acrylate; and acrylic ester monomers such as tetrahydrofurfuryl(meth)acrylate, fluoro(meth)acrylate, silicone (meth)acrylate, and 2-methoxyethyl acrylate. Examples also include isoprene, butadiene, isobutylene, and vinyl ether.

Copolymerizable monomers other than the above further include silane monomers containing a silicon atom. Examples of silane monomers include 3-acryloxypropyltriethoxysilane, vinyltrimethoxysilane, vinyltriethoxysilane, 4-vinylbutyltrimethoxysilane, 4-vinylbutyltriethoxysilane, 8-vinyloctyltrimethoxysilane, 8-vinyloctyltriethoxysilane, 10-methacryloyloxydecyltrimethoxysilane, 10-acryloyloxydecyltrimethoxysilane, 10-methacryloyloxydecyltriethoxysilane, and 10-acryloyloxydecyltriethoxysilane.

Examples of copolymerizable monomers that may also be used include polyfunctional monomers having two or more unsaturated double bonds such as those in (meth)acryloyl groups or vinyl groups, which include (meth)acrylic esters of polyhydric alcohols, such as tripropylene glycol di(meth)acrylate, tetraethylene glycol di(meth)acrylate, 1,6-hexanediol di(meth)acrylate, bisphenol A diglycidyl ether di(meth)acrylate, neopentyl glycol di(meth)acrylate, trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, and caprolactone-modified dipentaerythritol hexa(meth)acrylate; and polyester (meth)acrylates, epoxy (meth)acrylates, urethane (meth)acrylates, or other compounds having a polyester, epoxy, or urethane skeleton, to which two or more unsaturated double bonds are added in the form of functional groups such as (meth)acryloyl groups or vinyl groups in the same manner as the monomer components.

Concerning the weight ratios of all monomer components, the alkyl(meth)acrylate should be a main component of the acryl-based polymer, and the content of the copolymerizable monomer used to form the acryl-based polymer is preferably, but not limited to, 0 to about 20%, more preferably about 0.1 to about 15%, even more preferably about 0.1 to about 10%, based on the total weight of all monomer components.

Among these copolymerizable monomers, hydroxyl group-containing monomers are preferably used in view of tackiness or durability. When the pressure-sensitive adhesive composition contains a crosslinking agent, hydroxyl group-containing monomers can serve as a reactive site to the crosslinking agent. Such hydroxyl group-containing monomers are highly reactive with intermolecular crosslinking agents and therefore are preferably used to improve the cohesiveness or heat resistance of the resulting pressure-sensitive adhesive layer. When a hydroxyl group-containing monomer is added as a copolymerizable monomer, the content thereof is preferably from 0.01 to 15%, more preferably from 0.03 to 10%, even more preferably from 0.05 to 7%, based on the total weight of all monomer components.

Carboxyl group-containing monomers may corrode a transparent conductive thin film (a thin film of metal oxide such as ITO), an adherend to which the pressure-sensitive adhesive layer of the invention is bonded. Therefore, carboxyl group-containing monomers are preferably not used as copolymerizable monomers. Nevertheless, if a carboxyl group-containing monomer is added as a copolymerizable monomer, the content thereof should preferably be 1% by weight or less, more preferably 0.5% by weight or less, even more preferably 0.1% by weight or less, based on the total weight of all monomer components. Likewise, acid group-containing monomers such as acid anhydride group-containing monomers, sulfonic acid group-containing monomers, and phosphate group-containing monomers are each preferably used at the above content.

In the production of the acryl-based polymer, an aromatic group-containing monomer is also preferably used as a copolymerizable monomer to adjust (or increase) the refractive index of the acryl-based polymer, control the resulting pressure-sensitive adhesive layer, and control the pressure-sensitive adhesive properties, durability, and retardation. Aromatic group-containing monomers having an unsaturated double bond-containing polymerizable functional group such as a (meth)acryloyl group or a vinyl group and an aromatic group may be used. Examples of aromatic group-containing monomers include styrene monomers such as styrene and α-methylstyrene; vinyltoluene monomers such as vinyltoluene and α-vinyltoluene; heterocyclic ring-containing vinyl monomers such as vinylpyridine, vinylpiperidone, vinylpyrimidine, vinylpiperazine, vinylpyrazine, vinylpyrrole, vinylimidazole, vinyloxazole, and vinylmorpholine; aromatic ring-containing alkyl(meth)acrylates such as phenoxyethyl (meth)acrylate and benzyl (meth)acrylate; and heterocyclic ring-containing (meth)acrylic monomers such as N-acryloyl morpholine, N-acryloylpiperidine, N-methacryloylpiperidine, and N-acryloyl pyrrolidine. Among these aromatic group-containing monomers, styrene monomers are preferred in view of refractive index and compatibility.

The content of the aromatic group-containing monomer used to form the acryl-based polymer may be 50% or less based on the total weight of all monomer components (100% by weight) for the acryl-based polymer. The content of the aromatic group-containing monomer is preferably from 1 to 35% by weight, more preferably from 10 to 40% by weight, even more preferably from 20 to 35% by weight.

In the invention, the acryl-based polymer used generally has a weight average molecular weight in the range of 500,000 to 3,000,000. In view of durability, specifically, heat resistance, the weight average molecular weight of the polymer used is preferably from 700,000 to 2,700,000, more preferably from 800,000 to 2,500,000. A weight average molecular weight of less than 500,000 is not preferred in view of heat resistance. If the weight average molecular weight is more than 3,000,000, a large amount of a diluent solvent will be necessary for adjusting the viscosity for coating, which causes an increase in cost and is therefore not preferred. The weight average molecular weight refers to the polystyrene-equivalent value determined by gel permeation chromatography (GPC).

The method for producing such an acryl-based polymer may be appropriately selected from known production methods such as solution polymerization, bulk polymerization, emulsion polymerization, and various types of radical polymerization.

In solution polymerization, for example, ethyl acetate, toluene, or the like may be used as a polymerization solvent. An example of solution polymerization includes carrying out the reaction under a stream of inert gas such as nitrogen in the presence of a polymerization initiator typically under the reaction conditions of a temperature of about 50 to about 70° C. and a time period of about 5 to about 30 hours.

Any appropriately selected polymerization initiator, chain transfer agent, emulsifying agent, or the like may be used for radical polymerization. The weight average molecular weight of the acryl-based polymer can be controlled by the amount of the addition of the polymerization initiator or the chain transfer agent or by the reaction conditions. The amount of the addition may be adjusted as appropriate depending on the type of these materials.

Examples of the polymerization initiator include, but are not limited to, azo initiators such as 2,2'-azobisisobutyronitrile, 2,2'-azobis(2-amidinopropane)dihydrochloride, 2,2'-azobis[2-(5-methyl-2-imidazoline-2-yl)propane]dihydrochloride, 2,2'-azobis(2-methylpropionamidine)disulfate, 2,2'-azobis(N,N'-dimethyleneisobutylamidine), and 2,2'-azobis[N-(2-carboxyethyl)-2-methylpropionamidine]hydrate (VA-057 manufactured by Wako Pure Chemical Industries, Ltd.); persulfates such as potassium persulfate and ammonium persulfate; peroxide initiators such as di(2-ethylhexyl) peroxydicarbonate, di(4-tert-butylcyclohexyl)peroxydicarbonate, di-sec-butylperoxydicarbonate, tert-butylperoxyneodecanoate, tert-hexylperoxypivalate, tert-butylperoxypivalate, dilauroyl peroxide, di-n-octanoyl peroxide, 1,1,3,3-tetramethylbutylperoxy-2-ethyl hexanoate, di(4-methylbenzoyl) peroxide, dibenzoyl peroxide, tert-butylperoxyisobutylate, 1,1-di(tert-hexylperoxy)cyclohexane, tert-butylhydroperoxide, and hydrogen peroxide; and redox system initiators of a combination of a peroxide and a reducing agent, such as a combination of a persulfate and sodium hydrogen sulfite and a combination of a peroxide and sodium ascorbate.

These polymerization initiators may be used alone or in combination of two or more. The total content of the polymerization initiator(s) is preferably from about 0.005 to about 1 part by weight, more preferably from about 0.02 to about 0.5 parts by weight, based on 100 parts by weight of the monomers.

Examples of the chain transfer agent include lauryl mercaptan, glycidyl mercaptan, mercaptoacetic acid, 2-mercaptoethanol, thioglycolic acid, 2-ethylhexyl thioglycolate, and 2,3-dimercapto-1-propanol. The chain transfer agents may be used alone or in combination of two or more. The total content of the chain transfer agent(s) may be about 0.1 parts by weight or less, based on 100 parts by weight of the total amount of the monomer components.

Emulsion polymerization may also be performed using an emulsifying agent, examples of which include an anionic emulsifying agent such as sodium lauryl sulfate, ammonium lauryl sulfate, sodium dodecylbenzenesulfonate, ammonium polyoxyethylene alkyl ether sulfate, or sodium polyoxyethylene alkyl phenyl ether sulfate; and a nonionic emulsifying agent such as polyoxyethylene alkyl ether, polyoxyethylene alkyl phenyl ether, polyoxyethylene fatty acid ester, or a polyoxyethylene-polyoxypropylene block polymer. These emulsifying agents may be used alone or in combination of two or more.

The emulsifying agent may be a reactive emulsifier such as an emulsifier having an introduced radically polymerizable functional group such as a propenyl group or an allyl ether group, examples of which include AQUALON HS-10, HS-20, KH-10, BC-05, BC-10, and BC-20 (all manufactured by Dai-ichi Kogyo Seiyaku Co., Ltd.), and ADEKA REASOAP SE10N (manufactured by ADEKA CORPORATION), etc. The reactive emulsifier is preferred, because it can be incorporated by polymerization into a polymer chain to improve water resistance. Based on 100 parts by weight of the total amount of the monomer components, the emulsifying agent is preferably used in an amount of 0.3 to 5 parts by weight, more preferably 0.5 to 1 part by weight, in view of polymerization stability or mechanical stability.

When the acryl-based polymer is a copolymer, the copolymer may be of any form, such as a random copolymer, a block copolymer, or a graft copolymer. When the aromatic group-containing monomer is used as a copolymerizable monomer, the acryl-based polymer is preferably, in view of improvement of compatibility with the styrene-based oligomer added later, a graft polymer including an acryl-based polymer main chain, which includes the alkyl(meth)acrylate as a main component, and a side chain formed by graft polymerization of a monomer component including the aromatic group-containing monomer. For example, the graft polymer can be obtained by a process including preparing an acryl-based polymer for forming a main chain and then performing graft polymerization of a monomer component in the presence of a polymerization initiator. The content of the monomer component(s) subjected to graft polymerization is preferably, in view of tackiness, 50% by weight or less, more preferably from 10 to 40% by weight, even more preferably from 20 to 35% by weight, based on the total weight of all monomer components of the resulting acryl-based polymer (100% by weight). In the monomer components subjected to graft polymerization, the content of the aromatic group-containing monomer is preferably from 10 to 50% by weight, more preferably from 20 to 35% by weight, based on the total weight of all monomer components (100% by weight) for the acryl-based polymer. The monomer components subjected to graft polymerization may also include the alkyl(meth)acrylate or the copolymerizable monomer. The copolymerizable monomer is preferably a hydroxyl group-containing monomer or the like. The monomer components subjected to graft polymerization do not have to be entirely polymerized to the main chain and may form a separate polymer co-existing with the resulting graft polymer.

The acryl-based polymer used to form the pressure-sensitive adhesive layer of the invention may also be obtained by radiation polymerization of monomer components including the alkyl(meth)acrylate as a main component.

In the production of the acryl-based polymer by radiation polymerization, the monomer components are irradiated with radiation such as electron beams or ultraviolet rays so that they are polymerized. The radiation polymerization using electron beams does not particularly require the addition of a photopolymerization initiator to the monomer components. On the other hand, a photopolymerization initiator is used in the radiation polymerization using ultraviolet rays. The photopolymerization initiator may be of any type capable of producing radicals upon exposure to ultraviolet rays so that photopolymerization can be initiated, and any commonly used photopolymerization initiator can be advantageously used. Examples that may be used include benzoin ether type photopolymerization initiators, acetophenone type photopolymerization initiators, α-ketol type photopolymerization initiators, optically active oxime type photopolymerization initiators, benzoin type photopolymerization initiators, benzil type photopolymerization initiators, benzophenone type photopolymerization initiators, ketal type photopolymerization initiators, and thioxanthone type photopolymerization initiators.

More specifically, examples of benzoin ether type photopolymerization initiators include benzoin methyl ether, benzoin ethyl ether, benzoin propyl ether, benzoin isopropyl ether, benzoin isobutyl ether, 2,2-dimethoxy-1,2-diphenylethane-1-one, and anisoin methyl ether. Examples of acetophenone type photopolymerization initiators include 2,2-diethoxyacetophenone, 2,2-dimethoxy-2-phenylacetophenone, 1-hydroxycyclohexyl phenyl ketone, 4-phenoxydichloroacetophenone, and 4-tert-butyldichloroacetophenone. Examples of α-ketol type photopolymerization initiators include 2-methyl-2-hydroxypropiophenone and 1-[4-(2-hydroxyethyl)phenyl]-2-hydroxy-2-methylpropane-1-on e. Examples of optically active oxime type photopolymerization initiators include 1-phenyl-1,2-propanedione-2-(O-ethoxycarbonyl)-oxime and the like. Examples of benzoin type photopolymerization initiators include benzoin and the like. Examples of benzil type photopolymerization initiators include benzil and the like. Examples of benzophenone type photopolymerization initiators include benzophenone, benzoylbenzoic acid, 3,3'-dimethyl-4-methoxybenzophenone, polyvinyl benzophenone, and α-hydroxycyclohexyl phenyl ketone. Examples of ketal type photopolymerization initiators include benzyl dimethyl ketal and the like. Example of thioxanthone type photopolymerization initiators include thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, 2,4-diisopropylthioxanthone, and dodecylthioxanthone.

While the amount of the addition of the photopolymerization initiator is not restricted, the photopolymerization initiator is preferably used in an amount of 0.01 to 5 parts by weight, more preferably 0.03 to 3 parts by weight, based on 100 parts by weight of the monomer components.

In the production of the acryl-based polymer by radiation polymerization, the viscosity of the monomer components is preferably adjusted for handleability. For example, the viscosity of the monomer components may be adjusted by polymerization of part of the monomer components. The polymerization of part of the monomer components is preferably controlled so that the degree of conversion of the monomer components will be 10% by weight or less. If it is more than 10% by weight, the viscosity may be too high so that workability may be rather degraded. The viscosity can also be adjusted by adding various polymers such as thickening additives before or after polymerization of part of the monomer components. In addition, a polyfunctional monomer having two or more unsaturated double bonds can function as a crosslinking component. When the pressure-sensitive adhesive layer is formed by radiation polymerization, such a monomer is preferably added after polymerization of part of the monomer components. The polyfunctional monomer having two or more unsaturated double bonds is preferably added in an amount of 5% by weight or less, more preferably 3% by weight or less, based on the amount of the monomer components.

In the invention, the acrylic pressure-sensitive adhesive composition contains a styrene-based oligomer in addition to the acryl-based polymer (and optionally monomer components when radiation polymerization is performed). The styrene-based oligomer is used such that the acrylic pressure-sensitive adhesive composition will form a pressure-sensitive adhesive layer with a refractive index of 1.50 or more. To achieve such a refractive index, the styrene-based oligomer preferably has a refractive index of 1.53 to 1.65, more preferably 1.54 to 1.63. The acryl-based polymer and styrene-based oligomer used should be highly compatible with each other so that the resulting pressure-sensitive adhesive layer can have a haze of 2% or less as measured at a thickness of 30 μm.

Examples of the styrene-based oligomer include styrene oligomers, copolymers of styrene and α-methylstyrene, copolymers of vinyltoluene and α-methylstyrene, and hydrogenation products thereof. The hydrogenation products are partial hydrogenation products, in which some aromatic rings remain intact. Among these, styrene oligomers and copolymers of styrene and α-methylstyrene are preferred.

The softening point of the styrene-based oligomer is preferably 95° C. or less, more preferably 90° C. or less, even more preferably 85° C. or less, because the haze of the resulting pressure-sensitive adhesive layer tends to increase as the softening point increases. On the other hand, the softening point of the styrene-based oligomer is preferably 30° C. or more, more preferably 40° C. or more, so that lifting can be prevented, which would otherwise be caused by a step or the like formed in the patterned transparent conductive thin film. The styrene-based oligomer preferably includes at least one oligomer with a weight average molecular weight of 1,000 or more. The weight average molecular weight is more preferably from 1,000 to 4,000, even more preferably 1,100 or more.

Based on 100 parts by weight of the acryl-based polymer, the styrene-based oligomer is added in an amount of 30 to 150 parts by weight, preferably 30 to 100 parts by weight, more preferably 40 to 90 parts by weight. With such an amount, the refractive index of the pressure-sensitive adhesive layer is adjusted to a predetermined value. The pressure-sensitive adhesive layer is made from the acrylic pressure-sensitive adhesive composition so that the refractive index of the pressure-sensitive adhesive layer is adjusted to 1.50 or more. The adjustment of the refractive index reduces the difference in reflectance between the patterned and non-patterned parts to prevent degradation of the appearance. The refractive index of the pressure-sensitive adhesive layer is preferably 1.50 or more, more preferably 1.51 or more, even more preferably 1.53 or more. If the styrene-based oligomer is added in an amount of less than 30 parts by weight, the refractive index will not increase sufficiently, and if it is more than 150 parts by weight, the pressure-sensitive adhesive layer will be hard and have degraded pressure-sensitive adhesive properties, which is not preferred.

In the invention, the acrylic pressure-sensitive adhesive composition may further contain any of various crosslinking agents. The pressure-sensitive adhesive layer can be crosslinked with the added crosslinking agent so that it has improved heat resistance.

A crosslinking agent reactive with the functional group of the acryl-based polymer is advantageously used. Examples of the crosslinking agent include peroxides, isocyanate crosslinking agents, epoxy crosslinking agents, metal chelate crosslinking agents, melamine crosslinking agents, aziridine crosslinking agents, and metal salts. Alternatively, ultraviolet rays or electron beams may be used to crosslink the pressure-sensitive adhesive layer. While these crosslinking agents may be used alone or in combination of two or more, isocyanate crosslinking agents are preferred.

Examples of isocyanate crosslinking agents include diisocyanates such as tolylene diisocyanate, diphenylmethane diisocyanate, xylylene diisocyanate, isophorone diisocyanate, and hexamethylene diisocyanate, diisocyanate adducts modified with various polyols, and polyisocyanate compounds having an isocyanurate ring, a biuret moiety, or an allophanate moiety.

In general, based on 100 parts by weight of the acryl-based polymer, the crosslinking agent is preferably added in an amount of 0.01 to 5 parts by weight, more preferably 0.02 to 3 parts by weight, even more preferably 0.03 to 2 parts by weight.

In the invention, the acrylic pressure-sensitive adhesive composition may also contain any other known additive. Examples include a silane coupling agent, a powder of a colorant, a pigment or the like, a dye, a surfactant, a plasticizer, a surface lubricant, a leveling agent, a softening agent, an antioxidant, an age resistor, a light stabilizer, an ultraviolet absorbing agent, a polymerization inhibitor, an inorganic or organic filler, a metal powder, or a particulate or flaky material, which may be added as appropriate depending on the intended use. In this case, the amount of the addition should be adjusted so as not to significantly change the elastic modulus of the pressure-sensitive adhesive layer.

The pressure-sensitive adhesive layer of the invention may be produced by a process including applying the acrylic pressure-sensitive adhesive composition to a support and drying the composition. When the acrylic pressure-sensitive adhesive composition contains a crosslinking agent, a crosslinking treatment may be performed by a heat treatment or any other appropriate method. The crosslinking treatment may be performed at the temperature of the drying process, or an independent crosslinking treatment process may be performed after the drying process. When the acryl-based polymer is produced by radiation polymerization, the pressure-sensitive adhesive layer may be produced by a process including applying the acrylic pressure-sensitive adhesive composition to a support and then applying radiation to the composition. When the support is a release film, the pressure-sensitive adhesive layer formed on the release film may be bonded and transferred onto another base material to form a pressure-sensitive adhesive sheet.

The application process of the acrylic pressure-sensitive adhesive composition may be formed by any of various methods. Examples include roll coating, kiss roll coating, gravure coating, reverse coating, roll brushing, spray coating, dip roll coating, bar coating, knife coating, air knife coating, curtain coating, lip coating, and extrusion coating with a die coater or the like.

In the application process, the amount of the application is so controlled that a pressure-sensitive adhesive layer with a predetermined thickness (post-drying thickness) can be formed. The thickness (post-drying thickness) of the pressure-sensitive adhesive layer is generally from 10 to 100 μm, preferably from 15 to 80 μm, more preferably from 20 to 60 μm. If the pressure-sensitive adhesive layer has a thickness of less than 10 μm, it may have low adhesion to various types of adherends such as glass or film substrates and transparent conductive thin films in a touch panel structure, and adhesion between films may also be low in a laminated structure, so that durability may be insufficient at high temperature or high temperature and high humidity. On the other hand, if the pressure-sensitive adhesive layer has a thickness of more than 100 μm, thickness irregularities may occur in the application, the drying, or any other process for forming the pressure-sensitive adhesive layer, so that a problem with appearance may easily arise.

Subsequently, the applied aqueous dispersion-type pressure-sensitive adhesive is dried to form a pressure-sensitive adhesive layer. The drying temperature is generally from about 80 to about 170° C., preferably from 80 to 160° C., and the drying time period is generally from about 0.5 to about 30 minutes, preferably from 1 to 10 minutes. When radiation is applied, ultraviolet rays may be typically applied (intensity: 1-10 mW/cm$^2$, dose: 300-50,000 mJ/cm$^2$).

Preferably, when having a thickness of 30 μm, the pressure-sensitive adhesive layer has a haze of 2% or less to meet the transparency requirements for a transparent conductive film. The haze is preferably from 0 to 1%, more preferably from 0 to 0.5%.

The material used to form the release film may be any appropriate thin material, examples of which include a plastic film such as a polyethylene, polypropylene, polyethylene terephthalate, or polyester film, a porous material such as a paper sheet, a cloth, or a nonwoven fabric, a net, a foam sheet, a metal foil, and any laminate thereof. A plastic film is advantageously used because it has high surface smoothness.

Any plastic film capable of protecting the pressure-sensitive adhesive layer may be used, examples of which include a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyurethane film, and an ethylene-vinyl acetate copolymer film.

The thickness of the release film is generally from about 5 to about 200 μm, preferably from about 5 to about 100 μm. If necessary, the release film may be subjected to a release treatment and an antifouling treatment with a silicone, fluoride, long-chain alkyl, or fatty acid amide release agent, silica powder, or the like, or subjected to an antistatic treatment of coating type, kneading and mixing type, vapor-deposition type, or the like. Particularly when the surface of the release film is appropriately subjected to a release treatment such as a silicone treatment, a long-chain alkyl treatment, or a fluorine treatment, the releasability from the pressure-sensitive adhesive layer can be further increased.

When the pressure-sensitive adhesive layer is exposed, the pressure-sensitive adhesive layer may be protected by a release film until it is actually used. The release film may be used by itself as a separator for the pressure-sensitive adhesive layer, so that the process can be simplified.

Hereinafter, the pressure-sensitive adhesive layer of the invention for a transparent conductive film and the transparent conductive film with pressure-sensitive adhesive layer of the invention are described with reference to FIGS. 1 and 2. FIG. 1 is a cross-sectional view showing an example of the transparent conductive film with pressure-sensitive adhesive layer produced using the pressure-sensitive adhesive layer of the invention. The transparent conductive film with pressure-sensitive adhesive layer of FIG. 1 includes a first transparent plastic film substrate 1, a patterned transparent conductive thin film 2 provided on one surface of the substrate 1, and a pressure-sensitive adhesive layer 3 (the pressure-sensitive adhesive layer for a transparent conductive film) provided on the transparent conductive thin film 2. A release film 4 is provided on the pressure-sensitive adhesive layer 3. It should be noted that the patterned form of the transparent conductive thin film 2 is not shown in the drawing.

Figure 2:
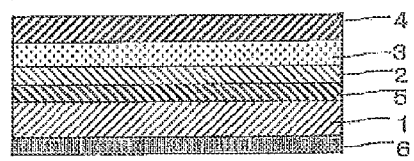
FIG. 2 is a cross-sectional view showing an example of the transparent conductive film with pressure-sensitive adhesive layer of the invention.

FIG. 2 shows another case in which the transparent conductive film with pressure-sensitive adhesive layer of FIG. 1 further includes an undercoat layer 5, the transparent conductive thin film 2 is provided on one surface of the first transparent plastic film substrate 1 with the undercoat layer 5 interposed therebetween, and the pressure-sensitive adhesive layer 3 is provided on the transparent conductive thin film 2. The release film 4 is provided on the pressure-sensitive adhesive layer 3. While FIG. 2 shows a single undercoat layer 5, the undercoat 5 may include two or more layers. An oligomer blocking layer 6 is provided on the other surface of the first transparent plastic film substrate 1 on the side where the transparent conductive thin film 2 is not provided. While the structure of FIG. 2 further includes the undercoat layer 5 and the oligomer blocking layer 6 in addition to the structure of FIG. 1, the transparent conductive film with pressure-sensitive adhesive layer of the invention may have the structure including the undercoat layer 5 or the oligomer blocking layer 6 in addition to the structure of FIG. 1.

The first transparent plastic film substrate 1 to be used may be, but not limited to, various transparent plastic films. The plastic film is generally formed of a monolayer film. Examples of the material for the transparent plastic film substrate 1 include polyester resins such as polyethylene terephthalate and polyethylene naphthalate, acetate resins, polyethersulfone resins, polycarbonate resins, polyamide resins, polyimide resins, polyolefin resins, (meth)acrylic resins, polyvinyl chloride resins, polyvinylidene chloride resins, polystyrene resins, polyvinyl alcohol resins, polyarylate resins, and polyphenylene sulfide resins. In particular, polyester resins, polyimide resins, and polyethersulfone resins are preferred.

The film substrate 1 preferably has a thickness of 15 to 200 μm, more preferably 25 to 188 μm. If the thickness of the film substrate 1 is less than 15 μm, the mechanical strength of the film substrate 1 may be insufficient, so that it may be difficult to perform the process of continuously forming the transparent conductive thin film 2 on the film substrate 1 being fed from a roll. If the thickness is more than 200 μm, the amount of introduction of the film substrate 1 may decrease in the process of forming the transparent conductive thin film 2, and the process of removing gas and water may be hindered, so that the productivity may decrease.

The surface of the film substrate 1 may be previously subject to sputtering, corona discharge treatment, flame treatment, ultraviolet irradiation, electron beam irradiation, chemical treatment, etching treatment such as oxidation, or undercoating treatment such that the adhesion of the transparent conductive thin film 2 or the undercoat layer 5 formed thereon to the transparent plastic film substrate 1 can be improved. If necessary, the film substrate 1 may also be subjected to dust removing or cleaning by solvent cleaning, ultrasonic cleaning or the like, before the transparent conductive thin film 2 or the undercoat layer 5 is formed.

Examples of materials, but are not limited to, are preferably used to form the transparent conductive thin film 2 include, metal oxides such as tin oxide-doped indium oxide and antimony-doped tin oxide.

For example, a metal oxide may be used to form the transparent conductive thin film 2. The metal oxide is preferably tin oxide-doped indium oxide. Such a metal oxide preferably contains 80 to 99% by weight of indium oxide and 1 to 20% by weight of tin oxide.

The thickness of the transparent conductive thin film 2 is preferably, but not limited to, 10 nm or more, in order that it may form a highly-conductive continuous coating film with a surface resistance of $1 \times 10^3$ Ω/square or less. If the thickness is too large, a reduction in transparency and so on may occur. Therefore, the thickness is preferably from 15 to 35 nm, more preferably from 20 to 30 nm. If the thickness is less than 15 nm, the surface electric resistance may be too high, and it may be difficult to form a continuous coating film. If the thickness is more than 35 nm, a reduction in transparency may occur.

The transparent conductive thin film 2 may be formed using known conventional methods, while the methods are not particularly limited. Examples of such methods include vacuum deposition, sputtering, and ion plating. Any appropriate method may be used depending on the required film thickness.

The undercoat layer 5 may be made of an inorganic material, an organic material or a mixture of an inorganic material and an organic material. Examples of the inorganic material include NaF (1.3), $Na_3AlF_6$ (1.35), LiF (1.36), $MgF_2$ (1.38), $CaF_2$ (1.4), $BaF_2$ (1.3), $SiO_2$ (1.46), $LaF_3$ (1.55), $CeF_3$ (1.63), and $Al_2O_3$ (1.63), wherein each number inside the parentheses is the refractive index of each material. In particular, $SiO_2$, $MgF_2$, $Al_2O_3$, or the like is preferably used. In particular, $SiO_2$ is preferred. Besides the above, a complex oxide containing about 10 to about 40 parts by weight of cerium oxide and about 0 to about 20 parts by weight of tin oxide based on 100 parts by weight of the indium oxide may also be used.

The undercoat layer made of an inorganic material may be form with a dry process such as vacuum deposition, sputtering or ion plating, a wet process (coating process), or the like. $SiO_2$ is preferably used as the inorganic material to form the undercoat layer as described above. In a wet process, a silica sol or the like may be applied to form a $SiO_2$ film.

Examples of the organic material include acrylic resins, urethane resins, melamine resins, alkyd resins, siloxane polymers, and organosilane-based condensates. At least one of these organic materials may be used. In particular, a thermosetting resin including a mixture composed of a melamine resin, an alkyd resin and an organosilane condensate is preferably used as the organic material.

When a plurality of undercoat layers 5 are formed, the first undercoat layer from the first transparent plastic film substrate 1 is preferably made of an organic material, and the undercoat layer most distant from the first transparent plastic film substrate 1 is preferably made of an inorganic material, in view of the processability of the resulting transparent conductive film with the pressure-sensitive adhesive layer. When two undercoat layers 5 are formed, therefore, the first undercoat layer from the first transparent plastic film substrate 1 is preferably made of an organic material, and the second undercoat layer is preferably made of an inorganic material.

The thickness of the undercoat layer 5 is generally, but not limited to, from about 1 to about 300 nm, preferably from 5 to 300 nm, in view of optical design and the effect of preventing the release of an oligomer from the film substrate 1. When two or more undercoat layers 5 are provided, the thickness of each layer may be from about 5 to about 250 nm, preferably from 10 to 250 nm.

Any appropriate material capable of forming a transparent film may be used to form the oligomer blocking layer 6, and such a material may be an inorganic material, an organic material, or a composite thereof. The oligomer blocking layer preferably has a thickness of 0.01 to 20 μm. The oligomer blocking layer 6 is often formed using a coating method with a coater, a spraying method, a spin coating method, an in-line coating method, or the like, while it may be formed using any other method such as vacuum deposition, sputtering, ion plating, spray thermal decomposition, chemical plating, or electroplating. The coating method may be performed using a resin component such as polyvinyl alcohol-based resin, acrylic resin, urethane resin, melamine resin, UV-curable resin, or epoxy resin, or a mixture of any of the above resins and inorganic particles of alumina, silica, mica, or the like. Alternatively, a polymer substrate may be formed by coextrusion of two or more layers so that a component of the substrate can have the function of the blocking layer 6. Other methods such as vacuum deposition, sputtering, ion plating, spray thermal decomposition, chemical plating, and electroplating may be performed using a metal such as gold, silver, platinum, palladium, copper, aluminum, nickel, chromium, titanium, iron, cobalt, tin, or any alloy thereof, a metal oxide such as indium oxide, tin oxide, titanium oxide, cadmium oxide, or any mixture thereof, or any other metal compound such as a copper iodide.

Among the examples of the oligomer blocking layer 6-forming material, polyvinyl alcohol-based resin is particularly suited for applications of the invention, because it has a high oligomer-blocking function. Polyvinyl alcohol-based resin includes polyvinyl alcohol as a principal component, and in general, it preferably has a polyvinyl alcohol content in the range of 30 to 100% by weight. When it has a polyvinyl content of 30% by weight or more, it can be highly effective in preventing oligomer precipitation. Water-borne resin such as polyester or polyurethane may be mixed with polyvinyl alcohol. The degree of polymerization of polyvinyl alcohol is generally, but not limited to, 300 to 4,000, and such polyvinyl alcohol is advantageous for applications. The degree of saponification of polyvinyl alcohol is generally, but not limited to, 70% by mole or more, preferably 99.9% by mole or more. Polyvinyl alcohol-based resin may be used in combination with a crosslinking agent. Examples of such a crosslinking agent include various compounds such as methylolated or alkylolated urea compounds, melamine compounds, guanamine compounds, acrylamide compounds, and polyamide compounds, epoxy compounds, aziridine compounds, blocked isocyanate, silane coupling agents, titanate coupling agents, and zirco-aluminate coupling agents. Any of these crosslinking components may be previously bonded to a binder polymer. Inorganic particles may also be added for the purpose of improving anchoring properties or lubricity, examples of which include silica, alumina, kaolin, calcium carbonate, titanium oxide, and barium salt particles. If necessary, an antifoaming agent, an application conditioner, a thickener, an organic lubricant, organic polymer particles, an antioxidant, an ultraviolet absorbing agent, a foaming agent, a dye, or any other additive may also be added.

The method for producing the transparent conductive film with pressure-sensitive adhesive layer of the invention may be any method capable of forming the above structure. The pressure-sensitive adhesive layer 3 is generally formed by a process including forming the transparent conductive thin film 2 (and optionally the undercoat layer 5) on one surface of the first transparent plastic film substrate 1 to form a transparent conductive film, then patterning the transparent conductive thin film 2, and then forming the pressure-sensitive adhesive layer 3 on the patterned transparent conductive thin film 2. The transparent conductive thin film 2 can be patterned by etching with an acid. The etching process may include covering the transparent conductive thin film with a patterning mask and etching the transparent conductive thin film with an etching solution. An acid is preferably used for the etching solution. The pressure-sensitive adhesive layer 3 may be formed directly on the patterned transparent conductive thin film 2. Alternatively, the pressure-sensitive adhesive layer 3 may be provided on the release film 4 and then bonded to the patterned transparent conductive thin film 2. The latter process is more advantageous in productivity, because when the latter process is used, the pressure-sensitive adhesive layer 3 can be continuously formed using the film substrate 1 in the form of a roll.

Figure 3:
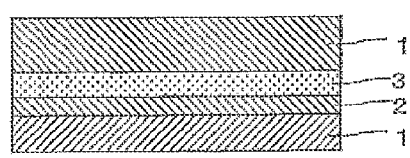
FIG. 3 is a cross-sectional view showing an example of the transparent conductive laminate of the invention.

As shown in FIG. 3, a second transparent plastic film substrate 1' may be further bonded to the pressure-sensitive adhesive layer 3 of the transparent conductive film with pressure-sensitive adhesive layer to form a transparent conductive laminate.

The second transparent plastic film substrate 1' may be bonded by a process of bonding the second transparent plastic film substrate 1' to the pressure-sensitive adhesive layer 3 of the transparent conductive film with pressure-sensitive adhesive layer shown in FIG. 1 or 2 or by process including providing the pressure-sensitive adhesive layer 3 on the second transparent plastic film substrate 1' and then bonding, to the pressure-sensitive adhesive layer 3, the film substrate 1 provided with the patterned transparent conductive thin film 2. The former process is more advantageous in productivity because when the former process is used, the pressure-sensitive adhesive layer 3 can be continuously formed using the film substrate 1 in the form of a roll.

The second transparent plastic film substrate 1' may be a single-layer structure as shown in FIG. 3. Alternatively, two or more second transparent plastic film substrates 1' may be laminated together with a transparent pressure-sensitive adhesive layer(s) to form a composite structure, which can increase the mechanical strength and other properties of the entire laminate. While FIG. 3 shows a case where the second transparent plastic film substrate 1' is bonded to the transparent conductive film with the pressure-sensitive adhesive layer shown in FIG. 1, a transparent conductive laminate may be similarly formed by bonding the second transparent plastic film substrate 1' to the transparent conductive film with the pressure-sensitive adhesive layer shown in FIG. 2.

A description will be given of a case where a single-layer structure is used as the second transparent plastic film substrate 1'. When the transparent conductive laminate is required to be flexible even after the single-layered second transparent plastic film substrate 1' is bonded, a plastic film with a thickness of about 6 to about 300 µm is generally used as the second transparent plastic film substrate 1'. When such flexibility is not particularly required, a glass plate or plastic film or plate with a thickness of about 0.05 to about 10 mm is generally used as the second transparent substrate 1'. The plastic material may be the same as that of the film substrate 1. When a multi-layer structure is used as the second transparent plastic film substrate 1', the same thickness as described above is preferably used.

Figure 4:
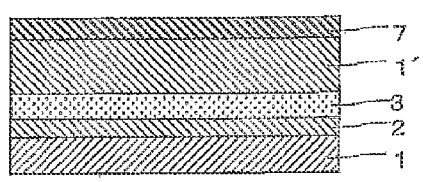
FIG. 4 is a cross-sectional view showing an example of the transparent conductive laminate of the invention.

In the transparent conductive laminate, a hard coat layer may be provided on one or both sides of the second transparent plastic film substrate 1'. In FIG. 4, a hard coat layer 7 is provided on one side (which is not bonded to the pressure-sensitive adhesive layer 3) of the second transparent plastic film substrate 1'. The hard coat layer 7 may be formed by subjecting the second transparent plastic film substrate to a hard coating process. For example, the hard coating process may be performed by a method including applying a hard resin such as an acrylic-urethane resin or a siloxane resin and curing the hard resin. The hard coating process may include adding a silicone resin or the like to the hard resin such as the acrylic-urethane resin or the siloxane resin to form a roughened surface, so that a non-glare surface capable of preventing reflections by a mirror effect in practical applications such as touch panels can be formed at the same time.

A too thin hard coat layer 7 may have insufficient hardness, while a too thick hard coat layer may be cracked. Also in view of the property of preventing curling and the like, the thickness of the hard coat layer 7 is preferably from about 0.1 to about 30 µm.

In addition to the hard coat layer 7, if necessary, an anti-glare or anti-reflection layer for improving the visibility may also be formed on the outer surface (which is not bonded to the pressure-sensitive adhesive layer 3) of the second transparent plastic film substrate.

The transparent conductive film with pressure-sensitive adhesive layer of the invention may be used to form various devices such as touch panels. In particular, the transparent conductive film with pressure-sensitive adhesive layer of the invention is preferably used as a touch panel-forming electrode plate. The invention is applicable to various types of touch panel, such as optical, ultrasonic, capacitive, and resistive touch panels. In particular, the transparent conductive film with pressure-sensitive adhesive layer of the invention is preferably used to form the electrode substrate of an input device in a capacitive touch panel, which is produced using a laminate of transparent conductive films each having a patterned transparent conductive thin film.

A capacitive touch panel generally includes a transparent conductive film that has a transparent conductive thin film in a specific pattern and is formed over the surface of a display unit. The transparent conductive film with pressure-sensitive adhesive layer and/or the transparent conductive laminate shown in FIGS. 1 to 4 is conveniently used to form a laminate.

EXAMPLES

Hereinafter, the invention is described in more detail with reference to the examples, which however are not intended to limit the gist of the invention. In each example, "parts" and "%" are all by weight.

Hereinafter, the invention is more specifically described with reference to the examples, which however are not intended to limit the invention. The molecular weight, the refractive index, and the softening point were measured by the methods described below.

<Method for Measuring Molecular Weight>

The weight average molecular weights of the acryl-based polymers and the styrene-based oligomers were measured by gel permeation chromatography (GPC) under the conditions below.

Analyzer: HLC-8120GPC manufactured by TOSOH CORPORATION

Columns (for acryl-based polymers): G7000$H_{XL}$–H+GM-$H_{XL}$–H+GMH$_{XL}$ manufactured by TOSOH CORPORATION Columns (for styrene-based oligomers): GM$_{HR}$–H+GM-H$_{HR}$+G2000 MH$_{HR}$ manufactured by TOSOH CORPORATION Column size: each 7.8 mmφ×30 cm, 90 cm in total Column temperature: 40° C.

Flow rate: 0.8 mL/minute

Eluent: tetrahydrofuran

Solution concentration: about 0.1% by weight

Injection volume: 100 μL

Detector: differential refractometer (RI)

Standard sample: polystyrene

Data processor: GPC-8020 manufactured by TOSOH CORPORATION

<Softening Point>

The softening point was measured by the ring and ball method according to JIS K 5902.

Example 1

Preparation of Acryl-Based Polymer

A monomer component (1) composed of 100 parts by weight of n-butyl acrylate and 3 parts by weight of 4-hydroxybutyl acrylate was added to a four-neck flask equipped with a stirring blade, a thermometer, a nitrogen gas introducing tube, and a condenser. To the flask were further added 0.1 parts by weight of 2,2'-azobisisobutyronitrile as a polymerization initiator and a solvent with an adjusted ratio of ethyl acetate/toluene=7/3 (volume ratio). Nitrogen gas was introduced for 1 hour to replace the air, while the mixture was gently stirred. The solvent was added in such an amount that the concentration of the monomer component (1) in the solution was 50% by weight. Subsequently, the mixture was subjected to a polymerization reaction for 8 hours, while the temperature of the liquid in the flask was kept at about 58° C., so that a solution containing an acryl-based polymer (1) with a weight average molecular weight of 900,000 was obtained. In this process, 2 hours after the start of the polymerization reaction, ethyl acetate was added dropwise over 1 hour so that the solid concentration reached 40% by weight.

Preparation of Graft Polymer

A graft monomer component (2) composed of 50 parts by weight of styrene and 2.5 parts by weight of 4-hydroxybutyl acrylate was added to the resulting acryl-based polymer (1)-containing solution based on 100 parts by weight of the solid of the solution. To the flask were further added 0.25 parts by weight of benzoyl peroxide as a polymerization initiator and ethyl acetate, and the air was sufficiently replaced by nitrogen gas. The ethyl acetate was added in such an amount that the total concentration of the solid of the acryl-based polymer (1) and the graft monomer component (2) in the solution was 30% by weight. Subsequently, the mixture was subjected to a polymerization reaction at 60° C. for 3 hours and at 70° C. for 3 hours with stirring under a nitrogen gas stream, so that the graft monomer component (2) was graft-polymerized to form a graft polymer-containing solution.

Preparation of Acrylic Pressure-Sensitive Adhesive Composition

Based on 100 parts by weight of the solid of the resulting graft polymer-containing solution, a solution of a styrene oligomer (SX-85 manufactured by Yasuhara Chemical Co., Ltd., 1,500 in weight average molecular weight, 78° C. in softening point) in toluene was added in an amount containing 80 parts by weight of the solid to the graft polymer-containing solution, and 1 part by weight of a trimethylolpropane-xylylene diisocyanate adduct (Takenate D-110N manufactured by Mitsui Chemicals Polyurethanes, Inc.) was further added to the mixture, so that an acrylic pressure-sensitive adhesive composition was obtained.

Preparation of Pressure-Sensitive Adhesive Layer

Subsequently, the resulting acrylic pressure-sensitive adhesive composition was applied to one side of a 38 μm thick, silicone-treated polyethylene terephthalate (PET) film so that a 30 μm thick pressure-sensitive adhesive layer could be formed after drying, and then dried at 110° C. for 3 minutes, so that a pressure-sensitive adhesive layer was obtained.

Example 2

In preparation of acryl-based polymer in Example 1, an acryl-based polymer (2) was prepared as in Example 1, except that a monomer component (2) composed of 700 parts by weight of n-butyl acrylate, 30 parts by weight of 2-methoxyethyl acrylate, and 1 part by weight of 4-hydroxybutyl acrylate was used instead of the monomer component (1). In Example 1, a graft polymer, an acrylic pressure-sensitive adhesive composition and a pressure-sensitive adhesive layer were prepared as in Example 1, except that the acryl-based polymer (2) was used instead of the acryl-based polymer (1).

Example 3

In preparation of acryl-based polymer in Example 1, an acryl-based polymer (3) was prepared as in Example 1, except that a monomer component (3) composed of 700 parts by weight of n-butyl acrylate, 30 parts by weight of N-vinylpyrrolidone, and 1 part by weight of 4-hydroxybutyl acrylate was used instead of the monomer component (1). In Example 1, a graft polymer, an acrylic pressure-sensitive adhesive composition and a pressure-sensitive adhesive layer were prepared as in Example 1, except that the acryl-based polymer (3) was used instead of the acryl-based polymer (1).

Example 4

In preparation of acrylic pressure-sensitive adhesive composition in Example 1, an acrylic pressure-sensitive adhesive composition was prepared as in Example 1, except that the acryl-based polymer (1) was used instead of the graft polymer. In Example 1, a pressure-sensitive adhesive layer was prepared as in Example 1, except that the resulting acrylic pressure-sensitive adhesive composition was used.

Example 5

In preparation of acrylic pressure-sensitive adhesive composition in Example 1, an acrylic pressure-sensitive adhesive composition was prepared as in Example 1, except that the acryl-based polymer (1) was used instead of the graft polymer and that the added amount of the styrene oligomer was changed to 50 parts by weight. In Example 1, a pressure-sensitive adhesive layer was prepared as in Example 1, except that the resulting acrylic pressure-sensitive adhesive composition was used.

Example 6

Partial Polymerization of Monomers

The monomer component (1) composed of 100 parts by weight of n-butyl acrylate and 3 parts by weight of 4-hydroxybutyl acrylate was added to a four-neck flask equipped with a stirring blade, a thermometer, a nitrogen gas introducing tube, and a condenser. In the flask were further mixed 0.05 parts by weight of IRGACURE 651 (manufactured by Ciba Japan K.K.) and 0.05 parts by weight of IRGACURE 184 (manufactured by Ciba Japan K.K.) as photopolymerization initiators. The mixture was then stirred under a nitrogen gas atmosphere so that the dissolved oxygen was sufficiently removed. Subsequently, ultraviolet ray (at an intensity of about 5 mW/cm$^2$ for 120 seconds) was applied to the mixture so that part of the monomer component (1) was polymerized to form a partial polymerization product (monomer syrup) with a degree of conversion of about 10%.

Preparation of Acrylic Pressure-Sensitive Adhesive Composition

To the partial polymerization product was added 0.5 parts by weight of trimethylolpropane triacrylate. A solution of a styrene oligomer (SX-85 manufactured by Yasuhara Chemical Co., Ltd., 1,500 in weight average molecular weight, 78° C. in softening point) in toluene was also added in an amount containing 80 parts by weight of the solid to the partial polymerization product. The materials were uniformly stirred and mixed to give an acrylic pressure-sensitive adhesive composition to be subjected to irradiation.

Preparation of Pressure-Sensitive Adhesive Layer

Subsequently, the resulting acrylic pressure-sensitive adhesive composition for irradiation was applied to one side of a 38 μm thick, silicone-treated polyethylene terephthalate (PET) film so that a 30 μm thick pressure-sensitive adhesive layer could be formed, and the same PET film was placed on the composition. Ultraviolet ray was then applied at an intensity of about 5 mW/cm$^2$ and a dose of about 36,000 mJ/cm$^2$ though the PET film to the composition, so that a pressure-sensitive adhesive layer was obtained.

Comparative Example 1

In preparation of acrylic pressure-sensitive adhesive composition in Example 1, an acrylic pressure-sensitive adhesive composition was prepared as in Example 1, except that the styrene oligomer was not added. In Example 1, a pressure-sensitive adhesive layer was prepared as in Example 1, except that the resulting acrylic pressure-sensitive adhesive composition was used.

Comparative Example 2

In preparation of acrylic pressure-sensitive adhesive composition in Example 2, an acrylic pressure-sensitive adhesive composition was prepared as in Example 2, except that the styrene oligomer was not added. In Example 2, a pressure-sensitive adhesive layer was prepared as in Example 2, except that the resulting acrylic pressure-sensitive adhesive composition was used.

Comparative Example 3

In preparation of acrylic pressure-sensitive adhesive composition in Example 3, an acrylic pressure-sensitive adhesive composition was prepared as in Example 3, except that the styrene oligomer was not added. In Example 3, a pressure-sensitive adhesive layer was prepared as in Example 3, except that the resulting acrylic pressure-sensitive adhesive composition was used.

Comparative Example 4

In preparation of acrylic pressure-sensitive adhesive composition in Example 1, an acrylic pressure-sensitive adhesive composition was prepared as in Example 1, except that the acryl-based polymer (1) was used instead of the graft polymer and that the styrene oligomer was not added. In Example 1, a pressure-sensitive adhesive layer was prepared as in Example 1, except that the resulting acrylic pressure-sensitive adhesive composition was used.

Comparative Example 5

In preparation of acrylic pressure-sensitive adhesive composition in Example 1, an acrylic pressure-sensitive adhesive composition was prepared as in Example 1, except that the styrene oligomer used in Example 1 was replaced by a high-softening-point styrene oligomer (SX-100 manufactured by Yasuhara Chemical Co., Ltd., 1,500 in weight average molecular weight, 100° C. in softening point). In Example 1, a pressure-sensitive adhesive layer was prepared as in Example 1, except that the resulting acrylic pressure-sensitive adhesive composition was used.

Comparative Example 6

In preparation of acrylic pressure-sensitive adhesive composition in Example 6, an acrylic pressure-sensitive adhesive composition was prepared as in Example 6, except that the styrene oligomer was not added. In Example 6, a pressure-sensitive adhesive layer was prepared as in Example 6, except that the resulting acrylic pressure-sensitive adhesive composition was used.

The pressure-sensitive adhesive layers obtained in the examples and the comparative examples were evaluated as described below. The results are shown in Table 1.

<Transparency>

The pressure-sensitive adhesive layer obtained in each example was peeled off from the release film and bonded to a slide glass plate (Model No. S1111 manufactured by Matsunami Glass Ind., Ltd.). The resulting laminate was measured for haze (%) by Reflectance/Transmittance Meter Model HR-100 manufactured by Murakami Color Research Laboratory Co., Ltd. in the atmosphere at 25° C. according to JIS K 7136. The haze of the pressure-sensitive adhesive layer was defined as the value obtained by subtracting the haze (0.2%) of the slide glass plate from the measured haze. The case where the haze was less than 2% is indicated by the symbol "○", while the case where the haze was 2% or more is indicated by the symbol "×".

<Refractive Index>

The refractive index of the pressure-sensitive adhesive layer obtained in each example was measured with sodium. D line on an Abbe refractometer (DM-M4 manufactured by Atago Co., Ltd.) in the atmosphere at 25° C.

<Visibility of Pattern>

A polyimide pressure-sensitive adhesive tape (1 cm in width) was bonded to a necessary part of the ITO film side of a transparent conductive film (ELECRYSTA V270L-TFMP manufactured by Nitto Denko Corporation) having a transparent conductive thin film (ITO film), in which the ITO film was needed to remain at the necessary part, so that a sample No. 1 was obtained. The sample No. 1 was immersed for 2 minutes in aqueous hydrochloric acid adjusted to 1 mol/l so that the ITO film was etched. Subsequently, the sample No. 1 was sufficiently washed with ion-exchanged water and then dried at 120° C. for 10 minutes. The polyimide pressure-sensitive adhesive tape was then removed from the sample No. 1, so that a transparent conductive film with a patterned ITO film was obtained. The patterned transparent conductive film was annealed at 140° C. for 90 minutes so that the patterned ITO film was crystallized. On the other hand, the pressure-sensitive adhesive layer obtained in each example was transferred onto a 100 μm thick PET film to form a PET film with pressure-sensitive adhesive layer. The PET film with pressure-sensitive adhesive layer was bonded to the patterned ITO film (crystal) of the resulting transparent conductive film, so that a sample No. 2 was obtained. The level of the visibility of the patterned ITO film in the sample No. 2 was visually evaluated under a fluorescent light according to the criteria below.

⊙: The pattern is almost invisible.
○: The pattern is slightly visible.
Δ: The pattern is visible.
−: The evaluation is not performed because the film has no transparency.

<Step-Absorbing Capability>

Figure 5:
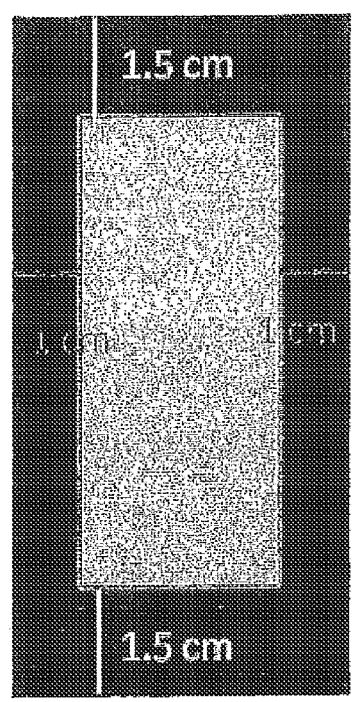
FIG. 5 is a top view of a glass plate with a step formed by printing, which is used in the evaluation of the "step-absorbing capability" of the examples.

The PET film with pressure-sensitive adhesive layer prepared for the evaluation of the visibility of pattern was bonded to a glass plate with a step formed by printing. FIG. 5 is a top view of the glass plate with a step formed by printing. The glass part placed inside has a size of 5 cm×10 cm×0.7 cm. The black part placed outside is a printed part with a step of 25 μm. Subsequently, the pressure-sensitive adhesive layer was allowed to stand at 85° C., 40° C., or room temperature (23° C.) for 24 hours, and then a defective state such as lifting of the bonded surface of the pressure-sensitive adhesive layer was evaluated according to the criteria below.

⊙: No lifting occurs at 85° C.,
○: No lifting occurs at 40° C.
Δ: No lifting occurs at room temperature.

TABLE 1

| | Acryl-based polymer | | | Styrene oligomer | | | | | |
| --- | --- | --- | --- | --- | --- | --- | --- | --- | --- |
| | Monomer component type | Presence or absence | | Softening | Added amount | Evaluations | | | |
| | (The values are weight ratios.) | of graft polymer | Polymerization mode | point (° C.) | (parts by weight) | Transparency | Refractive index | Visibility of pattern | Step-absorbing capability |
| Example 1 | (1): BA/HBA = 100/3 | Present | Solution | 78 | 80 | ○ | 1.53 | ○ | ○ |
| Example 2 | (2): BA/MEA/HBA = 70/30/1 | Present | Solution | 78 | 80 | ○ | 1.53 | ○ | ○ |
| Example 3 | (3): BA/NVP/HBA = 70/30/1 | Present | Solution | 78 | 80 | ○ | 1.54 | ⊙ | ○ |
| Example 4 | (1): BA/HBA = 100/3 | Absent | Solution | 78 | 80 | ○ | 1.52 | ○ | ○ |
| Example 5 | (1): BA/HBA = 100/3 | Absent | Solution | 78 | 50 | ○ | 1.51 | ○ | ○ |
| Example 6 | (1): BA/HBA = 100/3 | Absent | UV irradiation | 78 | 80 | ○ | 1.52 | ○ | ⊙ |
| Comparative Example 1 | (1): BA/HBA = 100/3 | Present | Solution | — | — | × | 1.47 | — | Δ |
| Comparative Example 2 | (2): BA/MEA/HBA = 70/30/1 | Present | Solution | — | — | × | 1.47 | — | Δ |
| Comparative Example 3 | (3): BA/NVP/HBA = 70/30/1 | Present | Solution | — | — | × | 1.49 | — | Δ |
| Comparative Example 4 | (1): BA/HBA = 100/3 | Absent | Solution | — | — | ○ | 1.46 | Δ | ⊙ |

TABLE 1-continued

|  | Acryl-based polymer | | | Styrene oligomer | | Evaluations | | | |
|---|---|---|---|---|---|---|---|---|---|
|  | Monomer component type (The values are weight ratios.) | Presence or absence of graft polymer | Polymerization mode | Softening point (° C.) | Added amount (parts by weight) | Transparency | Refractive index | Visibility of pattern | Step-absorbing capability |
| Comparative Example 5 | (1): BA/HBA = 100/3 | Absent | Solution | 100 | 80 | X | 1.53 | — | X |
| Comparative Example 6 | (1): BA/HBA = 100/3 | Absent | UV irradiation | — | — | ○ | 1.46 | Δ | ⊙ |

What is claimed is:

1. A pressure-sensitive adhesive layer for a transparent conductive film having a patterned transparent conductive thin film,
the pressure-sensitive adhesive layer being made from an acrylic pressure-sensitive adhesive composition containing:
100 parts by weight of an acryl-based graft polymer, and
30 parts by weight to 150 parts by weight of a styrene-based oligomer;
wherein the acryl-based graft polymer is obtained by:
polymerization of a monomer component including at least one alkyl (meth)acrylate to form a main polymer chain, and
graft polymerization of a monomer component including at least an aromatic group-containing monomer, separate from the styrene-based oligomer, in the presence of the main polymer chain and an initiator, the aromatic group-containing monomer being incorporated in the main polymer chain as a side chain by the graft polymerization, the aromatic group-containing monomer being selected from styrene monomers, vinyltoluene monomers, heterocyclic ring-containing vinyl monomers, aromatic ring-containing alkyl (meth)acrylates, and heterocyclic ring-containing (meth)acrylic monomers,
wherein content of the aromatic group-containing monomer is 1 wt % to 50 wt % based on total weight of all monomer components for the acryl-based graft polymer;
the pressure-sensitive adhesive layer has a refractive index of 1.50 or more, and
the pressure-sensitive adhesive layer has a haze of 2% or less as measured at a thickness of 30 μm.

2. The pressure-sensitive adhesive layer according to claim 1, wherein the styrene-based oligomer has a softening point of 95° C. or less.

3. The pressure-sensitive adhesive layer according to claim 1, wherein the acryl-based polymer is obtained by radiation polymerization of the monomer component including the alkyl (meth)acrylate.

4. A transparent conductive film with pressure-sensitive adhesive layer, comprising:
a first transparent plastic film substrate;
a patterned transparent conductive thin film provided on one surface of the substrate; and
the pressure-sensitive adhesive layer according to claim 1 provided on the transparent conductive thin film.

5. The transparent conductive film with pressure-sensitive adhesive layer according to claim 4, comprising at least one undercoat layer, wherein the transparent conductive thin film is provided on the first transparent plastic film substrate with the undercoat layer interposed therebetween.

6. The transparent conductive film with pressure-sensitive adhesive layer according to claim 4, comprising an oligomer blocking layer provided on another surface of the first transparent plastic film substrate, wherein the transparent conductive thin film is not provided on the another surface.

7. A transparent conductive laminate, comprising:
the transparent conductive film with pressure-sensitive adhesive layer according to claim 4; and
a second transparent plastic film substrate bonded to the pressure-sensitive adhesive layer of the transparent conductive film with pressure-sensitive adhesive layer.

8. A touch panel, comprising an electrode plate comprising the transparent conductive film with pressure-sensitive adhesive layer according to claim 4.

9. A touch panel, comprising an electrode plate comprising the transparent conductive laminate according to claim 7.

10. The pressure-sensitive adhesive layer according to claim 2, wherein the monomer component for forming the acryl-based polymer include an aromatic group-containing monomer as a copolymerizable monomer.

11. The pressure-sensitive adhesive layer according to claim 2, wherein the acryl-based polymer is obtained by radiation polymerization of the monomer component including the alkyl (meth)acrylate.

12. A transparent conductive film with pressure-sensitive adhesive layer, comprising:
a first transparent plastic film substrate;
a patterned transparent conductive thin film provided on one surface of the substrate; and
the pressure-sensitive adhesive layer according to claim 2 provided on the transparent conductive thin film.

13. A transparent conductive film with pressure-sensitive adhesive layer, comprising:
a first transparent plastic film substrate;
a patterned transparent conductive thin film provided on one surface of the substrate; and
the pressure-sensitive adhesive layer according to claim 5 provided on the transparent conductive thin film.

14. The transparent conductive film with pressure-sensitive adhesive layer according to claim 5, comprising an oligomer blocking layer provided on another surface of the first transparent plastic film substrate, wherein the transparent conductive thin film is not provided on the another surface.

* * * * *